United States Patent
Kobayashi et al.

(10) Patent No.: US 9,590,588 B2
(45) Date of Patent: Mar. 7, 2017

(54) PIEZOELECTRIC VIBRATING PIECE AND PIEZOELECTRIC VIBRATOR

(71) Applicant: SII Crystal Technology Inc., Chiba-shi, Chiba (JP)

(72) Inventors: Takashi Kobayashi, Chiba (JP); Naoya Ichimura, Chiba (JP)

(73) Assignee: SII CRYSTAL TECHNOLOGY INC., Chiba (JP)

( * ) Notice: Subject to any disclaimer, the term of this patent is extended or adjusted under 35 U.S.C. 154(b) by 0 days.

(21) Appl. No.: 15/041,558

(22) Filed: Feb. 11, 2016

(65) Prior Publication Data

US 2016/0268996 A1 Sep. 15, 2016

(30) Foreign Application Priority Data

Mar. 12, 2015 (JP) ................................. 2015-049779

(51) Int. Cl.
*H03H 9/21* (2006.01)
*H03H 9/10* (2006.01)
*G04C 3/12* (2006.01)

(52) U.S. Cl.
CPC ............ *H03H 9/21* (2013.01); *H03H 9/1014* (2013.01); *G04C 3/12* (2013.01)

(58) Field of Classification Search
CPC .... H03H 9/21; H03H 9/215; H03H 2003/026; H03H 2003/2468; H03H 2003/2473; H03H 2003/2484; H03H 2003/2494; H03H 3/04; H03H 2003/0492
USPC ....................................................... 310/370
See application file for complete search history.

(56) References Cited

U.S. PATENT DOCUMENTS

| | | | |
|---|---|---|---|
| 2006/0066185 A1* | 3/2006 | Tanaya ..................... | H03H 9/21 310/370 |
| 2006/0082261 A1* | 4/2006 | Tanaya ............... | G01C 19/5607 310/370 |
| 2009/0289530 A1* | 11/2009 | Kawanishi ........... | H03H 9/1021 310/370 |
| 2010/0084949 A1* | 4/2010 | Ichikawa ................. | H03H 3/04 310/370 |
| 2010/0096953 A1* | 4/2010 | Iwai ......................... | H03H 9/21 310/370 |
| 2014/0029179 A1* | 1/2014 | Yamada .................... | H03H 9/21 361/679.01 |
| 2015/0137901 A1* | 5/2015 | Yamada ................. | H03H 9/215 331/156 |

FOREIGN PATENT DOCUMENTS

| | | |
|---|---|---|
| JP | 2008-219066 A | 9/2008 |
| JP | 2011-223230 A | 11/2011 |
| JP | 5341647 B2 * | 11/2013 |

* cited by examiner

*Primary Examiner* — J. San Martin
(74) *Attorney, Agent, or Firm* — Brinks Gilson & Lione (57) ABSTRACT

A pair of vibrating arm portions are disposed lined up in a second direction perpendicular to a first direction and are configured such that base end sides thereof in the first direction are fixed to a base portion. A pair of inclined surfaces are formed on both sides in the second direction on the base end side of the vibrating arm portion so that a width of the vibrating arm portion in the second direction is gradually widened from the distal end side to the base end side. A length of a region, having the pair of inclined surfaces formed therein, in the first direction is set to equal to or greater than 0.25 times and equal to or less than 0.5 times of a total length of the vibrating arm portion from the base end to the distal end.

8 Claims, 9 Drawing Sheets

Fig.4A  L2/L1=0.2
EVALUATION : NG

Fig.4B  L2/L1=0.3
EVALUATION : OK

Fig.4C  L2/L1=0.4
EVALUATION : OK

Fig.4D  L2/L1=0.5
EVALUATION : OK

PIEZOELECTRIC VIBRATING PIECE AND PIEZOELECTRIC VIBRATOR

RELATED APPLICATIONS

This application claims priority under 35 U.S.C. §119 to Japanese Patent Application No. 2015-049779 filed on Mar. 12, 2015, the entire content of which is hereby incorporated by reference.

BACKGROUND OF THE INVENTION

Field of the Invention

The present invention relates to a piezoelectric vibrating piece and a piezoelectric vibrator.

Background Art

Piezoelectric vibrators using quartz crystal or the like as a time source, a timing source of a control signal, a reference signal source, or the like have been used in mobile phones and portable information terminal devices. As one of such types of piezoelectric vibrators, a piezoelectric vibrator accommodating a piezoelectric vibrating piece within a vacuum-sealed cavity has been known. According to the piezoelectric vibrator, it is possible to vibrate a vibrating arm portion by a predetermined resonance frequency by applying a voltage to an excitation electrode formed in the vibrating arm portion.

In a piezoelectric vibrating piece used in such a type of piezoelectric vibrator, an inclined surface (taper) is formed in a base end of a vibrating arm portion connected to a base portion. Thereby, it is possible to expect an effect of improving the strength of the vibrating arm portion.

For example, as disclosed in JP-A-2008-219066 and JPA-2011-223230, there has been kΩ own a type of piezoelectric vibrator in which a pair of supporting arm portions are provided so as to extend to both sides of a pair of vibrating arm portions from a base portion having the vibrating arm portions connected thereto and a piezoelectric vibrating piece is mounted in the vicinity of distal ends of the supporting arm portions. In the piezoelectric vibrating piece, a wide portion including a pair of inclined surfaces is provided on a base end side of the vibrating arm portion.

SUMMARY OF THE INVENTION

Incidentally, there have been increasing demands for a further reduction in the size of a piezoelectric vibrating piece and a decrease in a crystal impedance (CI value) (decrease to equal to or less than 80 kΩ) with a reduction in the size of an electronic device on which a piezoelectric vibrator is mounted. When the piezoelectric vibrating piece is made small, there is a tendency for a crystal impedance (hereinafter, referred to as a "CI value") of the piezoelectric vibrating piece to be increased, which results in a concern in that desired vibration characteristics cannot be obtained.

On the other hand, a method of decreasing a CI value includes a method of forming a wide hammer portion at a distal end of a vibrating arm portion. However, when a reduction in the size of a piezoelectric vibrating piece is pursued, there is a limitation in forming the wide hammer portion in terms of a space, which results in a difficulty in sufficiently decreasing a CI value.

According to an aspect of the present invention, there are provided a piezoelectric vibrating piece and a piezoelectric vibrator which are capable of achieving a reduction in a size and a decrease in a CI value.

According to an aspect of the present invention, there is provided a piezoelectric vibrating piece including a pair of vibrating arm portions that extend along a first direction, and a base portion that fixes the pair of vibrating arm portions. The pair of vibrating arm portions are disposed lined up in a second direction perpendicular to the first direction, and are configured such that base end sides thereof in the first direction are fixed to the base portion and distal end sides thereof in the first direction are configured to be capable of vibrating. A pair of inclined surfaces are formed on both sides in the second direction on the base end side of the vibrating arm portion so that a width of the vibrating arm portion in the second direction is gradually widened from the distal end side to the base end side. A length of a region, having the pair of inclined surfaces formed therein, in the first direction is set to equal to or greater than 0.25 times and equal to or less than 0.5 times of a total length of the vibrating arm portion from the base end to the distal end.

According to the present invention, the length of each of the pair of inclined surfaces provided on the base end side of the vibrating arm portion is set to equal to or greater than 0.25 times and equal to or less than 0.5 times of the total length of the vibrating arm portion. Accordingly, even when a reduction in size is pursued, it is possible to reduce a CI value to equal to or less than 80 kΩ and to reduce an oscillation frequency to equal to or less than 40 kΩ.

In addition, a base end-side end of an inner inclined surface on the base end side which is disposed on an inner side in the second direction out of the pair of inclined surfaces may be connected to an end face of the base portion on the distal end side. A base end-side end of an outer inclined surface on the base end side which is disposed on an outer side in the second direction out of the pair of inclined surfaces may be connected to an end face of the base portion in the second direction. The base end-side end of the outer inclined surface may be disposed closer to the distal end side than the base end-side end of the inner inclined surface.

According to the present invention, the base end-side end of the outer inclined surface is disposed closer to the distal end side than the base end-side end of the inner inclined surface, and thus it is possible to make the width of the base portion in the second direction smaller than that in a case where the outer inclined surface and the inner inclined surface are formed so as to be substantially bilaterally symmetrical to a center line of the vibrating arm portion. Therefore, it is possible to realize an improvement in the strength and a reduction in the size of the piezoelectric vibrating piece.

In addition, a groove portion extending along the first direction and having a fixed width in the second direction from the base end side of the vibrating arm portion to the distal end side thereof may be formed in front and back surfaces of the vibrating arm portion.

According to the present invention, the groove portion is formed, and thus electric field efficiency is improved and a CI value is decreased. Further, etching residue or the like unintentionally formed are not generated within the groove portion by the groove portion having a fixed width. Therefore, it is possible to improve vibration characteristics. Incidentally, when the width of the groove is changed in the middle thereof, there is a concern for a reduction in strength at an inflection point or the regeneration of etching residue.

In addition, when the base end-side end of the outer inclined surface is disposed closer to the distal end side than the base end-side end of the inner inclined surface, an electrode formed on the outer inclined surface and an electrode formed within the groove portion come close to each other, and thus electric field efficiency on the base end side of the vibrating arm portion is improved, and it is possible to contribute to a decrease in a CI value.

In addition, a distal end-side groove end of the groove portion may be disposed closer to the distal end side than the distal end-side end of the outer inclined surface, and a base end-side groove end of the groove portion may be disposed closer to the base end side than the base end-side end of the outer inclined surface.

According to the present invention, it is possible to form the long groove portion. Therefore, it is possible to contribute to an increase in electric field efficiency.

In addition, a total length of the vibrating arm portion may be equal to or less than 0.1 mm, an oscillation frequency thereof may be equal to or less than 40 kHz, and a CI value thereof may be equal to or less than 80 kΩ.

According to the present invention, it is possible to configure a microminiature piezoelectric vibrator and to contribute to reductions in the size and power consumption of an electronic device.

In addition, the piezoelectric vibrating piece may further include a pair of supporting arm portions that extend along the first direction on an outer side of the pair of vibrating arm portions in the second direction, and a connecting portion that connects the base portion and the supporting arm portion. The pair of supporting arm portions may be provided with a mounting electrode which is electrically connected to an outside.

According to the present invention, the piezoelectric vibrating piece can be mounted on, for example, a package through the mounting electrode of the supporting arm portion, and thus it is possible to secure a long distance between the vibrating arm portion and the mounting electrode of the supporting arm portion. Thereby, it is possible to suppress vibration leakage without increasing the total length of the piezoelectric vibrating piece. Therefore, it is possible to suppress vibration leakage while realizing a further reduction in the size of the piezoelectric vibrating piece.

In addition, the piezoelectric vibrating piece may further include a supporting arm portion that extends along the first direction between the pair of vibrating arm portions. The supporting arm portion may be provided with a mounting electrode which is electrically connected to an outside.

According to the present invention, the piezoelectric vibrating piece can be mounted on, for example, a package through the mounting electrode of the supporting arm portion, and thus it is possible to secure a long distance between the vibrating arm portion and the mounting electrode of the supporting arm portion. Thereby, it is possible to suppress vibration leakage without increasing the total length of the piezoelectric vibrating piece. In addition, in the piezoelectric vibrating piece, one supporting arm portion is disposed between the pair of vibrating arm portions, and thus the piezoelectric vibrating piece can be formed to have a small width in the second direction compared to a structure in which a pair of supporting arm portions are disposed on the outer side of the pair of vibrating arm portions. Therefore, it is possible to suppress vibration leakage while realizing a further reduction in the size of the piezoelectric vibrating piece.

According to another aspect of the present invention, there is provided a piezoelectric vibrator including a package that includes a base substrate and a lid substrate bonded to each other and accommodates the piezoelectric vibrating piece in a cavity formed between both the substrates.

According to the present invention, it is possible to achieve reductions in a size and an oscillation frequency.

According to the present invention, even when a reduction in size is pursued, it is possible to reduce a CI value to equal to or less than 80 kΩ and to reduce an oscillation frequency to equal to or less than 40 kΩ.

BRIEF DESCRIPTION OF THE DRAWINGS

FIGS. 5A and 5B are characteristic diagrams illustrating experiment results of the plurality of samples of the piezoelectric vibrating pieces that differ in a ratio of a total length L1 of a vibrating arm portion to a length L2 of an inclined surface.

DETAILED DESCRIPTION OF THE INVENTION

Hereinafter, embodiments of the present invention will be described with reference to the accompanying drawings.

First Embodiment

Figure 1:
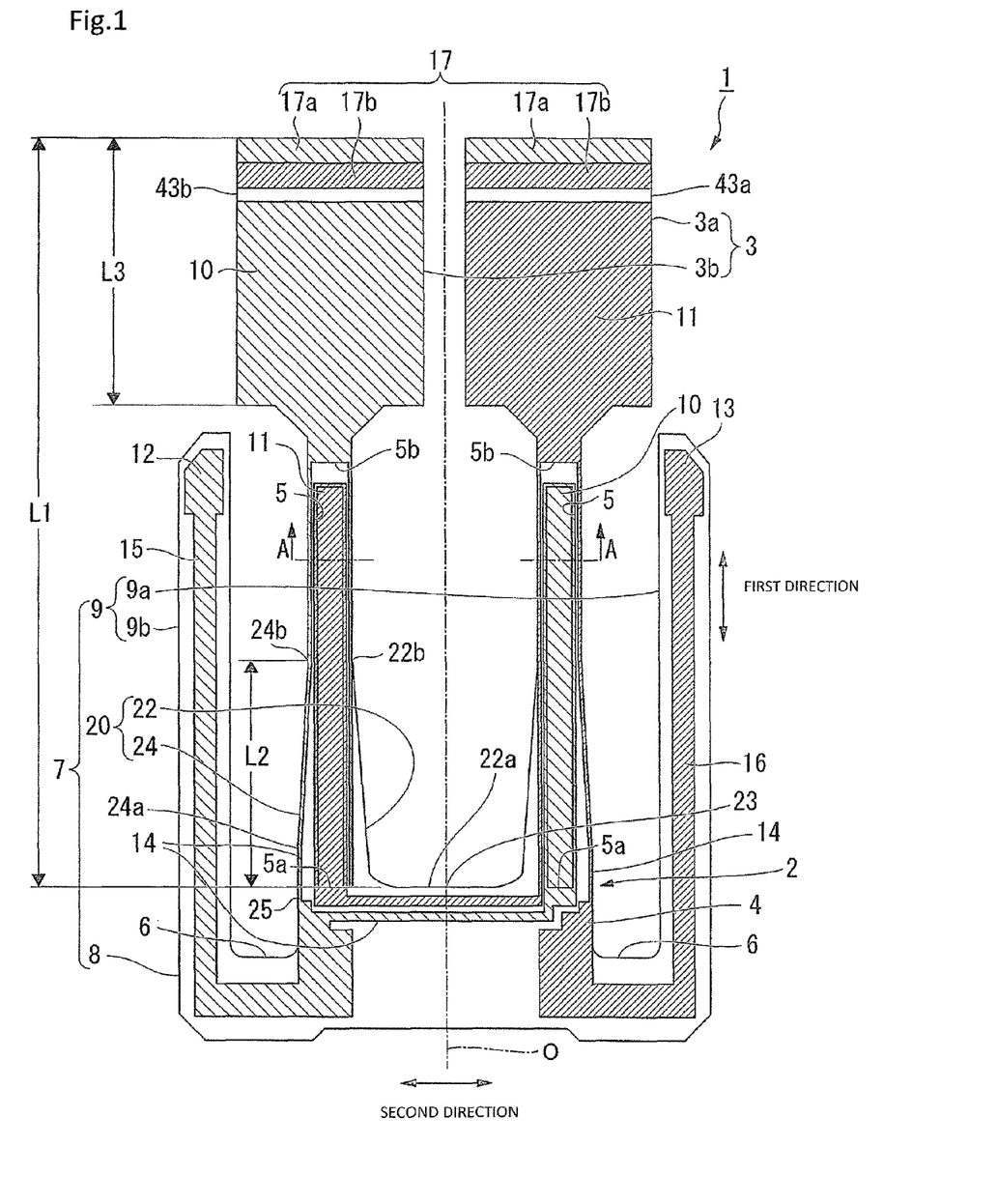
FIG. 1 is a plan view illustrating a configuration on a surface side of a piezoelectric vibrating piece according to a first embodiment.

FIG. 1 is a plan view of a surface side of a piezoelectric vibrating piece 1. In the present embodiment, a description will be given by taking a tuning fork type piezoelectric vibrating piece which is a type with a groove portion as an example of a piezoelectric vibrating piece 1.

As illustrated in FIG. 1, the piezoelectric vibrating piece 1 includes a tuning fork type piezoelectric plate 2 formed of a piezoelectric material such as quartz crystal, lithium tantalite, or lithium niobate.

The piezoelectric plate 2 includes a vibrating portion 3 which is formed so as to extend along a direction (hereinafter, referred to as a "first direction") which is parallel to a center axis O, and a base portion 4 that supports a base end of the vibrating portion 3. The vibrating portion 3 includes a pair of vibrating arm portions 3a and 3b that are disposed lined up in a direction (hereinafter, referred to as a "second direction") which is perpendicular to the center axis O.

The pair of vibrating arm portions 3a and 3b is disposed along the first direction. Each of the vibrating arm portions 3a and 3b is formed such that the width thereof on a distal end side in the second direction is larger than the width thereof on a base end side in the second direction. That is, the distal ends of the pair of vibrating arm portions 3a and 3b are respectively provided with hammer portions 43a and 43b of which the widths are enlarged compared to those of the base end sides thereof (so-called hammer head type).

In this manner, the hammer portions 43a and 43b are provided, and thus it is possible to make the distal ends of the respective vibrating arm portions 3a and 3b heavier and to increase the moment of inertia during vibration. For this reason, it is possible to easily vibrate the vibrating arm portions 3a and 3b and to reduce the length of the vibrating arm portions 3a and 3b to that extent, thereby easily achieving a reduction in size.

The base portion 4 connects one side ends of the pair of vibrating arm portions 3a and 3b in the first direction. A supporting portion 7 is connected to the base portion 4 through a connecting portion 6. The supporting portion 7 includes a supporting base portion 8 and a supporting arm portion 9 (pair of supporting arm portions 9a and 9b). The connecting portion 6 is provided between the base portion 4 and the supporting base portion 8. The connecting portion 6 extends toward the outside in the second direction from both end faces of the base portion 4 in the second direction and is connected to the supporting base portion 8.

The pair of supporting arm portions 9a and 9b extend in the first direction from the supporting base portion 8. The pair of supporting arm portions 9a and 9b are disposed on both sides of the vibrating portion 3 in the second direction. The piezoelectric vibrating piece 1 according to the present embodiment is a so-called side arm type piezoelectric vibrating piece in which the vibrating portion 3 is disposed between the pair of supporting arm portions 9a and 9b in the second direction.

Figure 2:
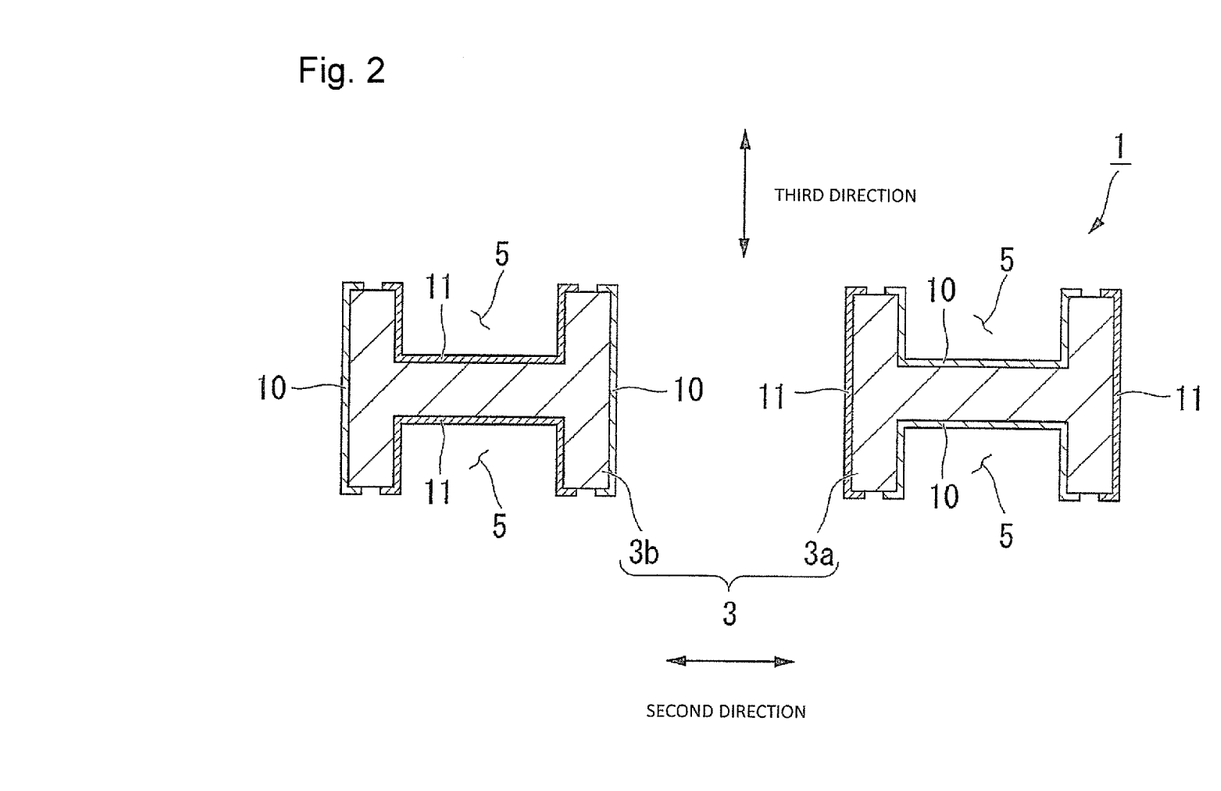
FIG. 2 is a cross-sectional view illustrating a configuration taken along line II-II in FIG. 1.

FIG. 2 is a cross-sectional view taken along line II-II illustrated in FIG. 1.

As illustrated in FIGS. 1 and 2, groove portions 5 having a fixed width are formed from the base ends of the vibrating arm portions 3a and 3b toward the distal ends thereof on principal surfaces (front and back surfaces) of the pair of vibrating arm portions 3a and 3b mentioned above. The groove portion 5 is formed over a range crossing an intermediate portion from the base end sides of the respective vibrating arm portions 3a and 3b. Thereby, each of the pair of vibrating arm portions 3a and 3b is formed to have an H-shaped cross section as illustrated in FIG. 2. Meanwhile, a formation region on the base end side of the groove portion 5 will be described later in detail.

As illustrated in FIG. 1, a pair of excitation electrodes 10 and 11 and a pair of mounting electrodes 12 and 13 are formed on the outer surface of the piezoelectric plate 2 formed in this manner. Among these, the pair of excitation electrodes 10 and 11 are electrodes that vibrate the pair of vibrating arm portions 3a and 3b with a predetermined resonance frequency in a direction in which the vibrating arm portions come close to or separate from each other when a voltage is applied thereto, and are respectively formed on the outer surfaces of the pair of vibrating arm portions 3a and 3b so as to be patterned in an electrically disconnected state.

Specifically, an excitation electrode 10 is mainly formed within the groove portion 5 of the vibrating arm portion 3a and on the lateral side of the other vibrating arm portion 3b, and the excitation electrode 11 is mainly formed within the groove portion 5 of the other vibrating arm portion 3b and on the lateral side of the vibrating arm portion 3a.

The pair of excitation electrodes 10 and 11 is electrically connected to a base portion extraction electrode 14 which is formed on the outer surface including the principal surface and the lateral side of the base portion 4. The pair of mounting electrodes 12 and 13 is provided at the distal ends of the principal surfaces of the pair of supporting arm portions 9a and 9b, respectively. The pair of mounting electrodes 12 and 13 are electrically connected to each other through arm portion extraction electrodes 15 and 16 from the base portion extraction electrode 14. The arm portion extraction electrodes 15 and 16 are formed along the principal surfaces of the connecting portion 6, the supporting base portion 8, and the supporting arm portions 9a and 9b. In this manner, the pair of excitation electrodes 10 and 11 are configured such that a voltage is applied thereto through the pair of mounting electrodes 12 and 13.

Meanwhile, the above-mentioned excitation electrodes 10 and 11, mounting electrodes 12 and 13, base portion extraction electrode 14, and arm portion extraction electrodes 15 and 16 are laminated films including, for example, chromium (Cr) and gold (Au), and are electrodes obtained by forming a chromium film having good adhesiveness to quartz crystal as a base and then applying a gold thin film to the surface thereof. However, the present invention is not limited to this case. For example, a gold thin film may further be laminated on the surface of a laminated film of chromium and nichrome (NiCr), or a single-layered film such as chromium, nickel, aluminum (Al), or titanium (Ti) may be used.

In addition, as illustrated in FIG. 1, the hammer portions 43a and 43b at the distal ends of the pair of vibrating arm portions 3a and 3b are provided with a weight metal film 17 (including a coarse film 17a and a fine film 17b) for performing adjustment (frequency adjustment) so that its own vibration state vibrates within a range of a predetermined frequency. The frequency adjustment is performed using the weight metal film 17, and thus it is possible to make the frequency of the pair of vibrating arm portions 3a and 3b fall within a range of a nominal frequency of a device.

In the present embodiment, a pair of inclined surfaces 20 are formed on both sides of the base end sides of the vibrating arm portions 3a and 3b in the second direction. The inclined surfaces 20 are formed such that the widths of the vibrating arm portions 3a and 3b in the second direction are gradually widened from the distal end side to the base end side. Therefore, a portion in which the pair of inclined surfaces 20 are formed is also referred to as a wide portion of which the width is widened more than on the distal end side.

Here, when the total length from the base ends to the distal ends of the vibrating arm portions 3a and 3b is set to be L1 and the length of a region (wide portion) having the pair of inclined surfaces 20 formed therein in the first direction is set to be L2, L2 is set to a length of equal to or greater than 0.25 times and equal to or less than 0.5 times of L1. In other words, the relation of L2/L1=0.25 to 0.5 is set.

By performing setting in this manner, it is possible to realize a CI value of equal to or less than 80 kΩ and to realize an oscillation frequency of equal to or less than 40 kΩ. This will be described later in detail.

Figure 3:
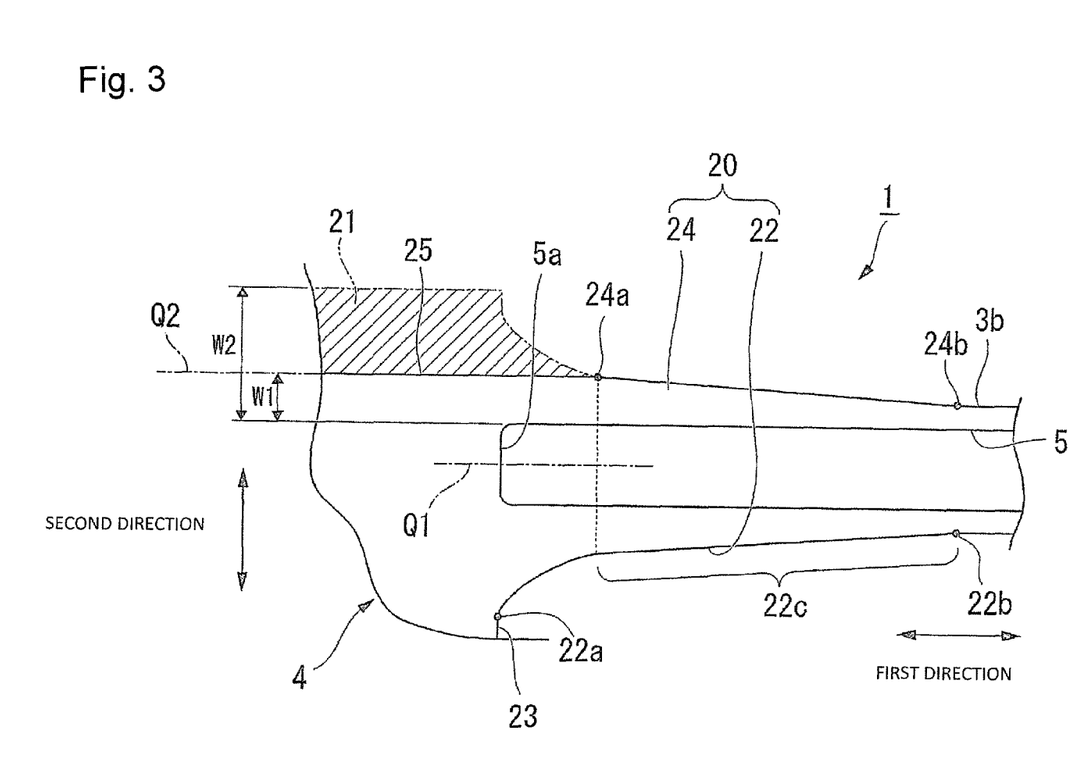
FIG. 3 is a schematic diagram illustrating an inclined surface illustrated in FIG. 1 together with a virtual external portion.

FIG. 3 is a schematic diagram illustrating the inclined surface 20 illustrated in FIG. 1 together with the virtual external portion 21. Meanwhile, in FIG. 3, the external form of the virtual external portion 21 is illustrated by a two-dot chain line.

A base end-side end 22a of an inner inclined surface 22 on the base end side which is disposed on the inner side in the second direction out of the pair of inclined surfaces 20 is connected to an end face 23 of the base portion 4 on the distal end side. In addition, a base end-side end 24a of an outer inclined surface 24 on the base end side which is disposed on the outer side in the second direction out of the pair of inclined surfaces 20 is connected to an end face 25 of the base portion in the second direction.

The base end-side end 24a of the outer inclined surface 24 is disposed closer to the distal end side than the base end-side end 22a of the inner inclined surface 22. In addition, a distal end-side end 24b of the outer inclined surface 24 on the distal end side and a distal end-side end 22b of the inner inclined surface 22 on the distal end side are disposed at the same position in the first direction. The outer inclined surface 24 and a portion 22c of the inner inclined surface 22 on the distal end side are formed so as to be substantially bilaterally symmetrical to a center line Q1 that divides each of the vibrating arm portions 3a and 3b into two equal parts in the second direction when seen in a plan view.

The outer inclined surface 24 and the inner inclined surface 22 can be configured as straight lines when seen in a plan view in FIG. 3 (Meanwhile, the wording "straight line" as used herein refers to a strict straight line but also to a straight line capable of being macroscopically interpreted in a case where the straight line includes a very small amount of irregularities which are unintentionally formed during a manufacturing process. Hereinafter, the definition of "straight line" will follow this).

In addition, the outer inclined surface 24 and the inner inclined surface 22 can be configured as broken lines formed by connecting a plurality of straight lines having an angle of inclination gradually changing, when seen in a plan view in FIG. 3. Further, the outer inclined surface 24 and the inner inclined surface 22 can be configured as curved lines having a curvature gradually decreasing toward the base portion 4, when seen in a plan view in FIG. 3. In addition, the outer inclined surface 24 and the inner inclined surface 22 can be configured by connecting the above-mentioned straight line, broken line, and curved line, when seen in a plan view in FIG. 3.

Here, a base end-side groove end 5a of the groove portion 5 is disposed closer to the base end side than the base end-side end 24a of the outer inclined surface 24. In addition, a distal end-side groove end 5b of the groove portion 5 is disposed closer to the distal end side than the distal end-side end 24b of the outer inclined surface 24. Further, the excitation electrode 10 (11) formed in a portion on the distal end side in the end face 25 of the base portion 4 in the second direction and the excitation electrode 11 (10) formed on the inner wall surface of the groove portion 5 are disposed facing each other (see FIG. 2 for the excitation electrodes 10 and 11).

Therefore, a width W1 between the inner wall surface of the groove portion 5 and the end face 25 of the base portion 4 becomes smaller than a width W2 between an inner wall surface of a groove portion and an end face of a base portion in the related art to the extent of the width of the base portion 4 being narrowed in the second direction. Thereby, in the piezoelectric vibrating piece 1 including the groove portion 5, electric field efficiency in the vicinity of the outer inclined surface 24 is improved.

The piezoelectric vibrating piece 1 is a microminiature piece in which the total length of the vibrating arm portions 3a and 3b is set to equal to or less than 0.1 mm. In addition, the oscillation frequency and CI value thereof are suppressed to equal to or less than 40 kHz and equal to or less than 80 kΩ, respectively. When the piezoelectric vibrating piece 1 is used, it is possible to configure a microminiature piezoelectric vibrator and to contribute to reductions in the size and power consumption of an electronic device.

Next, operations of the piezoelectric vibrating piece 1 will be described.

According to the piezoelectric vibrating piece 1, the pair of inclined surfaces 20 having a width in the second direction being gradually widened over the base end side are formed on both sides of the vibrating arm portions 3a and 3b in the second direction. The inclined surface 20 is configured such that the widths of portions of the vibrating arm portions 3a and 3b connected to the base portion 4 are gradually widened toward the base portion 4. Thereby, the impact resistance of the vibrating arm portions 3a and 3b is increased. In addition, the inventors have found out as a result of wholehearted examination that a crystal impedance (hereinafter, a CI value) of the piezoelectric vibrating piece 1 is reduced by an increase in impact resistance.

In addition, a ratio of the total length L1 between the base ends of the vibrating arm portions 3a and 3b to the distal ends thereof and the length L2 of the region (wide portion) having the pair of inclined surfaces 20 formed therein in the first direction, that is, L2/L1 is set to be in a range of 0.25 to 0.5. Thereby, the inventors have found out as a result of wholehearted examination that it is possible to reduce a CI value to equal to or less than 80 kΩ and to reduce an oscillation frequency to equal to or less than 40 kΩ) even when a reduction in the size of the piezoelectric vibrating piece 1 is pursued.

This will be described with reference to FIGS. 4A to 4D and FIGS. 5A and 5B.

Figure 4A:
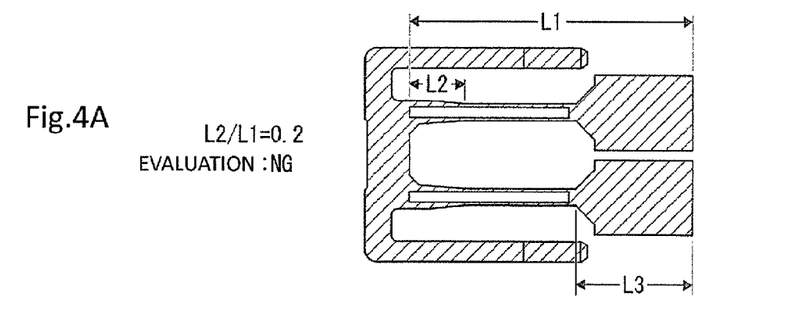
FIGS. 4A to 4D are plan views illustrating a plurality of samples (a) to (d) of piezoelectric vibrating pieces that differ in a ratio of a total length L1 of a vibrating arm portion to a length L2 of an inclined surface.

FIGS. 4A to 4D illustrate four types of samples (a) to (d) of piezoelectric vibrating pieces 1 that differ in a ratio of a total length L1 of a vibrating arm portion to a length L2 of an inclined surface. In addition, FIGS. 5A and 5B are characteristic diagrams illustrating experiment results of the plurality of samples of the piezoelectric vibrating pieces that differ in a ratio of L1 to L2, FIG. 5A is a diagram illustrating a relationship between L2/L1 and an oscillation frequency, and FIG. 5B is a diagram illustrating a relationship between L2/L1 and a CI value The sample in FIG. 4A is an example in a case of L2/L1=0.2. When L1 is set to 750 μm, L2 is set to 150 μm.

Figure 4B:
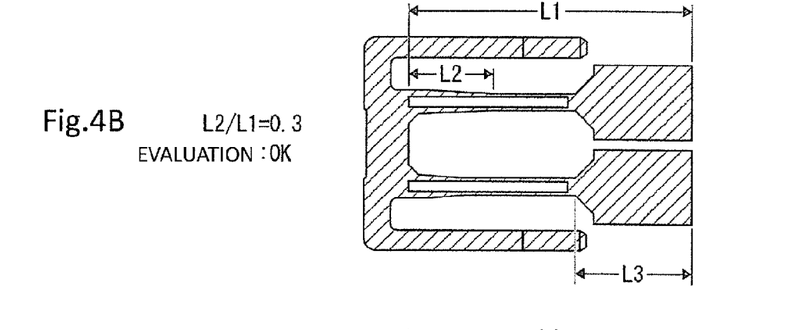
Figure 5A:
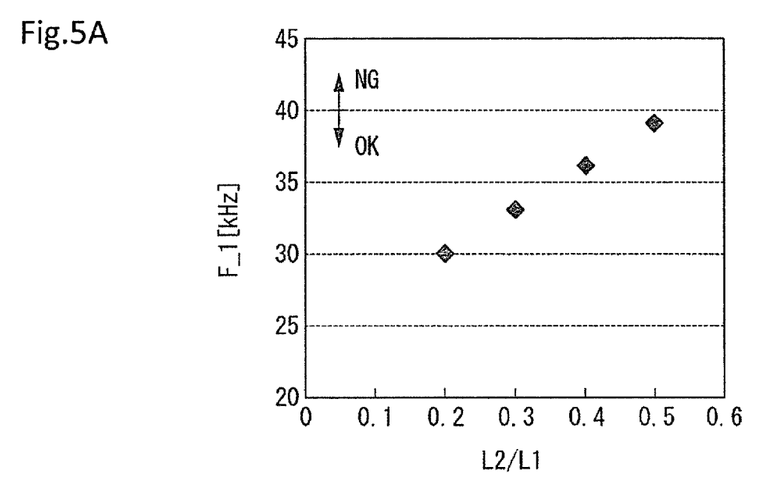
FIG. 5A is a diagram illustrating a relationship between L2/L1 and an oscillation frequency.
Figure 5B:
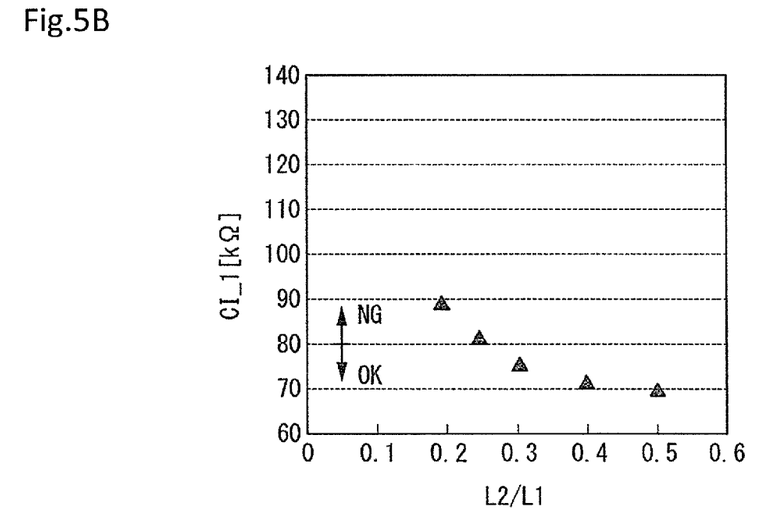
FIG. 5B is a diagram illustrating a relationship between L2/L1 and a CI value.

The sample in FIG. 4B is an example in a case of L2/L1=0.3. When L1 is set to 750 μm, L2 is set to 225 μm.

Figure 4C:
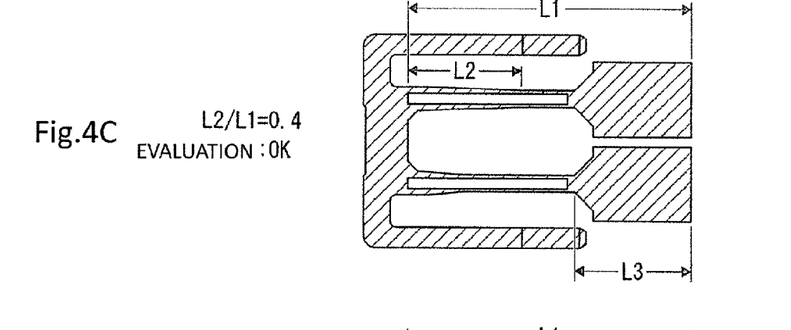

The sample in FIG. 4C is an example in a case of L2/L1=0.4. When L1 is set to 750 μm, L2 is set to 300 μm.

Figure 4D:
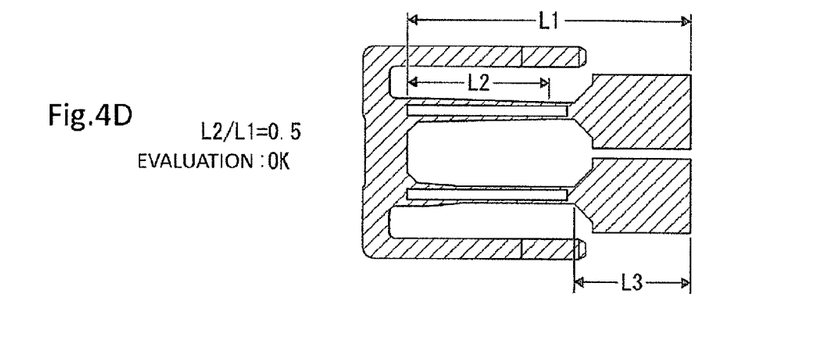

The sample in FIG. 4D is an example in a case of L2/L1=0.5. When L1 is set to 750 μm, is set to 375 μm.

When an experiment was performed on the four samples, results illustrated in FIGS. 5A and 5B are obtained. As seen from the result in FIG. 5A, when the value of L2/L1 becomes larger than 0.5, an oscillation frequency F_1 exceeds 40 kHz. Here, a required oscillation frequency is equal to or less than 40 kHz, and thus the value of L2/L1 has to be suppressed to equal to or less than 0.5.

In addition, as seen from the result in FIG. 5B, when the value of L2/L1 is set to equal to or less than 0.2, it can be understood that a CI value (here, a CI_1 value) exceeds 80 kΩ. Consequently, an experiment was additionally performed on a sample in which L2/L1=0.25 in order to search for a boundary value. As a result, it can be understood that the CI value is suppressed to 80 kΩ when the value of L2/L1 is equal to or greater than 0.25.

As described above, among the four samples of (a) to (d) illustrated in FIGS. 4A to 4D, a determination result obtained with respect to the sample of (a) in which L2/L1=0.2 was NG (failure), and determination results obtained with respect to the samples of (b) to (d) were OK (success).

As described above, it became clear that it is possible to realize a CI value of equal to or less than 80 kΩ and to realize an oscillation frequency of equal to or less than 40 kΩ by setting L2/L1 to 0.25 to 0.5.

Incidentally, the distal end sides of the vibrating arm portions 3a and 3b are displaced in the second direction, and thus the entire inclined surfaces 20 have been formed so as to be substantially bilaterally symmetrical to each other for the purpose of unifying vibration balance. However, when the base portion 4 is formed to be gradually widened in a state where the inclined surfaces 20 are substantially bilaterally symmetrical to each other, the width of the base portion in the second direction is increased. An increase in the width of the base portion 4 hinders a reduction in the size thereof. In addition, the base portion 4 is required to have a small width in order to suppress vibration leakage. For this reason, the base portion 4 may have a constriction (so-called notch), but in this case, the shape thereof becomes complicated.

Consequently, in the piezoelectric vibrating piece 1 according to the present embodiment, the base end-side end 24a of the outer inclined surface 24 is disposed closer to the distal end side than the base end-side end 22a of the inner inclined surface 22. In other words, the outer inclined surface 24 has a shape in which a portion (virtual external portion 21, hatched portion) located further outside than a virtual line Q2 along the first direction illustrated in FIG. 3 in the inclined surfaces 20 which are substantially bilaterally symmetrical to each other is excluded. Meanwhile, the wording "excluded" is not limited to meaning of being cut off, and includes meaning of being formed in the original form. The position of the virtual line Q2 is a position along the end face 25 of the base portion 4 in the second direction. The base portion 4 can be formed to have a small width in the second direction to the extent of the virtual external portion 21 not being required.

At this time, the inner inclined surface 22 and the outer inclined surface 24 are not substantially bilaterally symmetrical to a center line that divides each of the vibrating arm portions 3a and 3b into two equal parts in the second direction when seen as a whole. However, in the piezoelectric vibrating piece 1 according to the present embodiment, it is kΩ own that a reduction in the width of the base portion 4 brings about a great advantage in terms of vibration characteristics. Thereby, the piezoelectric vibrating piece 1 can suppress vibration leakage by a simple shape having no notch and can be made small. Further, it is possible to secure the strength of the vibrating arm portions 3a and 3b.

In addition, according to the piezoelectric vibrating piece 1, the groove portion 5 is formed in the front and back surfaces of each of the vibrating arm portions 3a and 3b. The vibrating arm portions 3a and 3b bend and vibrate by an electric field being formed in the inner wall surface of the groove portion 5 and the end face (also including the outer inclined surface 24) of the base portion 4 in the second direction. When the width of the inner wall surface of the groove portion 5 and the width of the end face of the base portion 4 are large, electric field efficiency is degraded.

In the piezoelectric vibrating piece 1 according to the present embodiment, the width W1 between the inner wall surface of the groove portion 5 and the end face 25 of the base portion 4 becomes smaller than the width W2 between the inner wall surface of the groove portion and the end face of the base portion in the related art to the extent of the width of the base portion 4 being narrowed in the second direction. Thereby, in the piezoelectric vibrating piece 1 including the groove portion 5, the virtual external portion 21 mentioned above is particularly excluded, and thus electric field efficiency in the vicinity of the outer inclined surface 24 is improved. In other words, an electrode formed on the outer inclined surface 24 and an electrode formed within the groove portion 5 become close to each other, and thus electric field efficiency on the base end side of the vibrating arm portions 3a and 3b is improved. As a result, a CI value is decreased, thereby allowing power to be saved.

In addition, the inventors have found out as a result of wholehearted examination that there is a higher tendency for vibration characteristics to be improved in a case where electric field efficiency in the vicinity of the base ends of the vibrating arm portions 3a and 3b is improved than, for example, in a case where electric field efficiency on the distal end sides of the vibrating arm portions 3a and 3b is improved. Specifically, it is possible to expect effects of easily stably obtaining a desired frequency and decreasing a CI value.

In addition, according to the piezoelectric vibrating piece 1, etching residue or the like unintentionally formed are not generated within the groove portion 5 by the groove portion 5 having a fixed width. Therefore, it is possible to improve vibration characteristics. Incidentally, when the width of the groove is changed in the middle thereof, there is a concern for a reduction in strength at an inflection point or the regeneration of etching residue.

In addition, according to the piezoelectric vibrating piece 1, the distal end-side groove end 5b of the groove portion 5 is disposed closer to the distal end side than the distal end-side end 24b of the outer inclined surface 24, and the base end-side groove end 5a of the groove portion 5 is disposed closer to the base end side than the base end-side end 24a of the outer inclined surface 24, and thus it is possible to form a long groove portion 5, which contributes to an increase in electric field efficiency.

In addition, according to the piezoelectric vibrating piece 1, it is possible to mount the piezoelectric vibrating piece on, for example, a package through the mounting electrodes 12 and 13 of the supporting arm portion 9. In the piezoelectric vibrating piece 1, it is possible to secure a long distance between the connecting portion 6 and the mounting electrodes 12 and 13 of the supporting arm portion 9 in the base portion 4. Thereby, it is possible to suppress vibration leakage without increasing the total length of the piezoelectric vibrating piece 1. As a result, it is possible to suppress an increase in a CI value and to suppress a degradation of the quality of an output signal. The base portion 4 can be formed to have a small width in the second direction to the extent of the above-mentioned virtual external portion 21 of each of the vibrating arm portions 3a and 3b not being required.

In addition, according to the piezoelectric vibrating piece 1, the hammer portions 43a and 43b having a large width are formed at the distal ends of the vibrating arm portions 3a and 3b, respectively. It is preferable that a total length L3 of each of the hammer portions 43a and 43b in the first direction is equal to or greater than 30% and equal to or less than 45% with respect to the total length L1 of each of the vibrating arm portions 3a and 3b. When the hammer portions 43a and 43b having the length L3 of equal to or greater than 30% are provided, it is easy to suppress a CI value to equal to or less than 80Ω. On the other hand, this is because it is possible to secure necessary strength by suppressing the length L3 of each of the hammer portions 43a and 43b to equal to or less than 45% of the total length L1 of each of the vibrating arm portions 3a and 3b.

First Modification Example of First Embodiment

Next, a piezoelectric vibrating piece 1B according to a first modification example of the first embodiment will be described.

Figure 6:
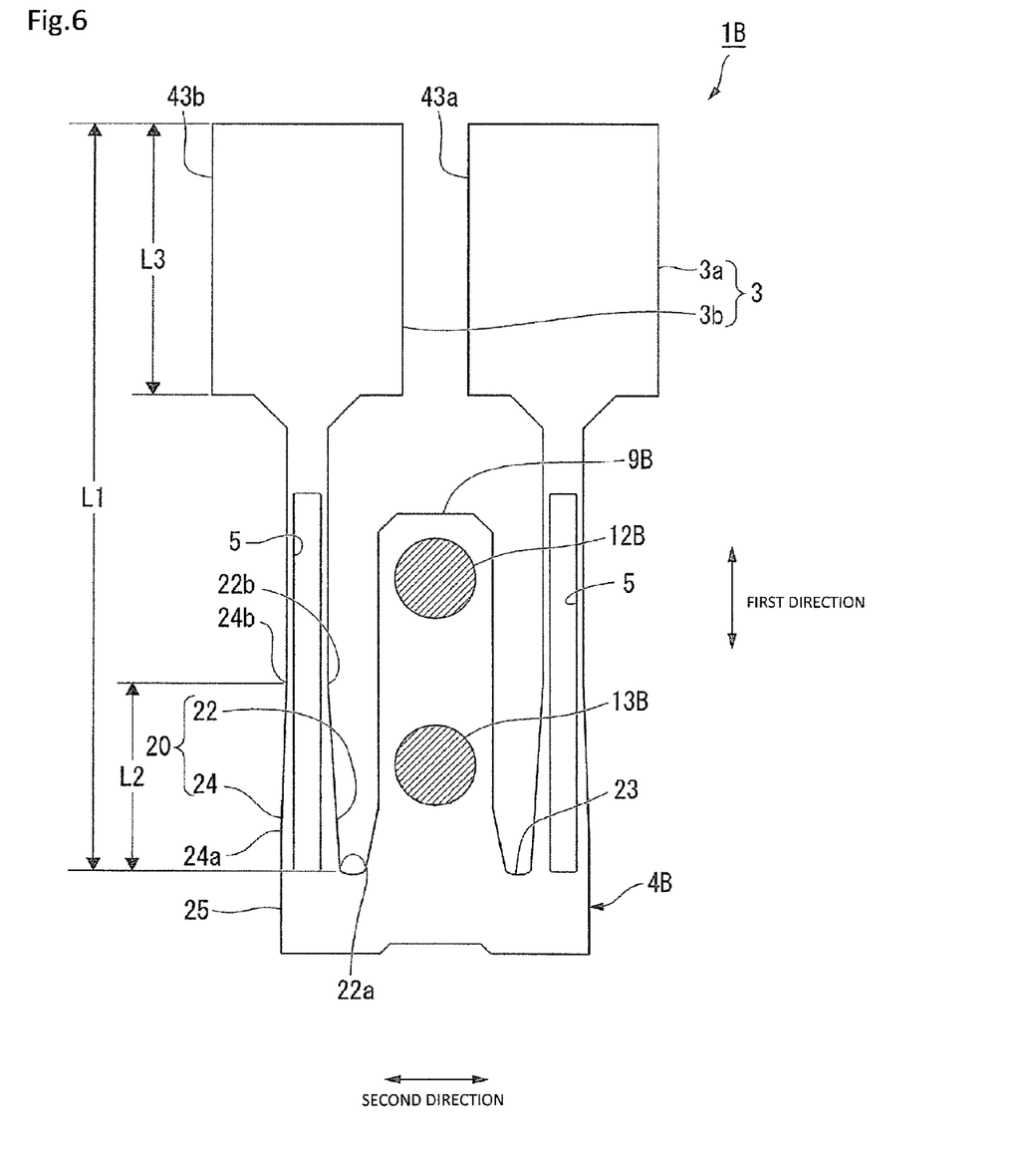
FIG. 6 is a plan view illustrating a configuration on a surface side of a piezoelectric vibrating piece according to a first modification example of the first embodiment.

FIG. 6 is a plan view illustrating a configuration on a surface side of the piezoelectric vibrating piece 1B according to the first modification example of the first embodiment. Meanwhile, in the following description, components in common with those in the above-described configuration will be denoted by the same reference numerals and signs, and a description thereof will be omitted here. Excitation electrodes 10 and 11, mounting electrodes 12 and 13, and the like have the same configurations as those in the above-described embodiment, and thus are not shown in the drawing.

In the piezoelectric vibrating piece 1B according to the first modification example, a supporting arm portion 9B is formed on an end face 23 of a base portion 4B on the distal end side between a pair of vibrating arm portions 3a and 3b. The piezoelectric vibrating piece 1B according to the first modification example is a so-called center arm type piezoelectric vibrating piece in which the supporting arm portion 9B is formed to extend toward the distal end side along the first direction. The supporting arm portion 9B is provided with mounting electrodes 12B and 13B.

According to the piezoelectric vibrating piece 1B, it is possible to mount the piezoelectric vibrating piece on, for example, a package through the supporting arm portion 9B. In the piezoelectric vibrating piece 1B, it is possible to secure a long distance between the vibrating arm portions 3a and 3b and the mounting electrodes 12B and 13B of the supporting arm portion 9B. Thereby, it is possible to suppress vibration leakage without increasing the total length of the piezoelectric vibrating piece 1B. As a result, it is possible to suppress an increase in a CI value and to suppress a degradation of the quality of an output signal.

In addition, in the piezoelectric vibrating piece 1B, one supporting arm portion 9B is disposed between the pair of vibrating arm portions 3a and 3b, and thus the piezoelectric vibrating piece can be formed to have a small width in the second direction compared to a structure in which a pair of supporting arm portions are disposed on the outer side of the vibrating arm portions. The base portion 4B can be formed to have a small width in the second direction to the extent of the above-mentioned virtual external portion 21 of each of the vibrating arm portions 3a and 3b not being required.

Second Modification Example of First Embodiment

Next, a piezoelectric vibrating piece 1C according to a second modification example of the first embodiment will be described.

Figure 7:
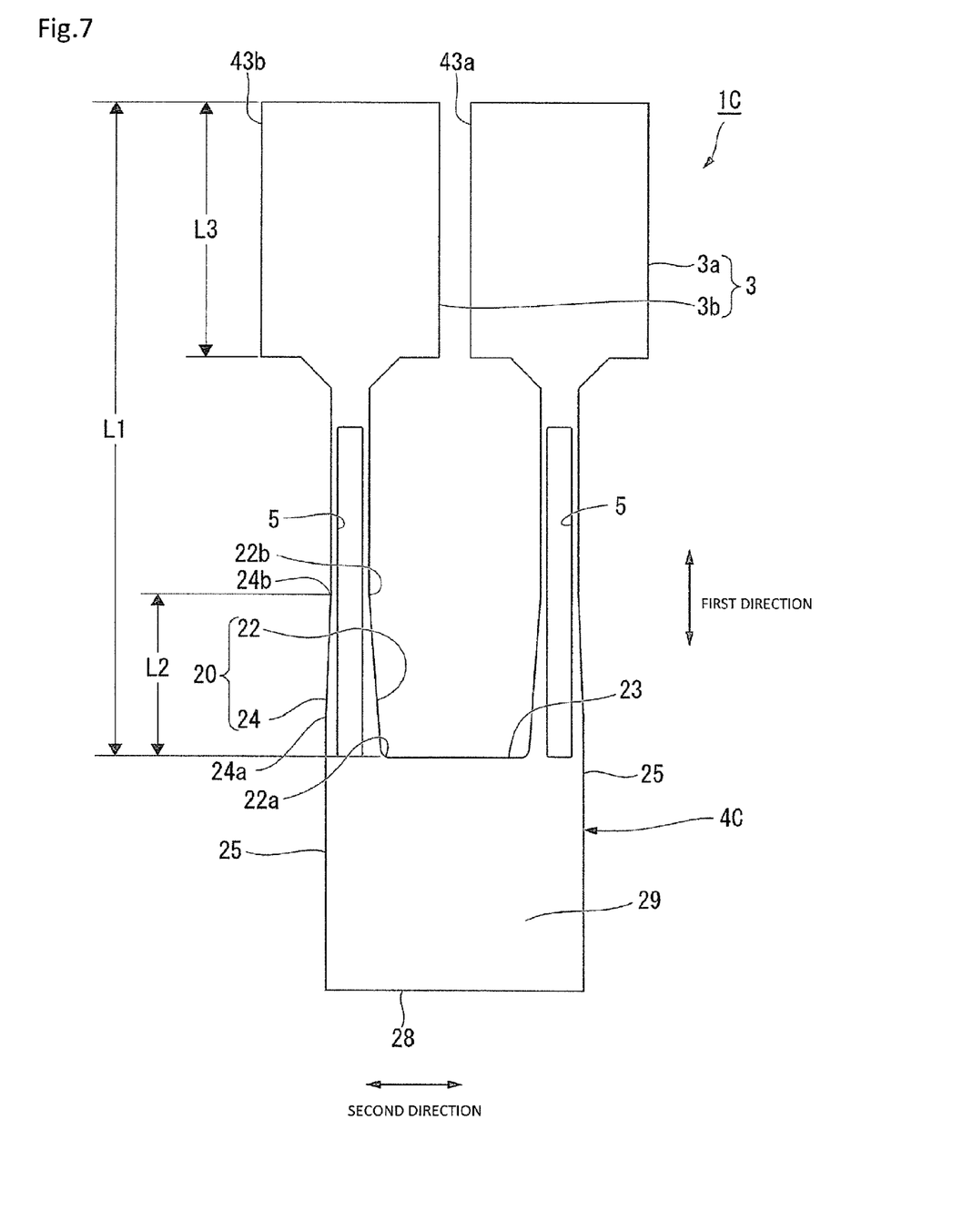
FIG. 7 is a plan view illustrating a configuration on a surface side of a piezoelectric vibrating piece according to a second modification example of the first embodiment.

FIG. 7 is a plan view illustrating a configuration on a surface side of the piezoelectric vibrating piece 1C according to the second modification example of the first embodiment.

The piezoelectric vibrating piece 1C according to the second modification example is formed to have a quadrangular plate shape in which a base portion 4C includes a pair of end faces 25 in the second direction, an end face 23 of the base portion 4C on the distal end side, and an end face 28 of the base portion 4C on the rear end side at four side portions thereof. The base portion 4C is provided with a mounting electrode (not shown in FIG. 7) which is electrically connected to the outside.

According to the piezoelectric vibrating piece 1C, it is possible to mount the piezoelectric vibrating piece on, for example, a package through the base portion 4C. In the piezoelectric vibrating piece 1C, a supporting arm portion extending from the base portion 4C becomes unnecessary, and thus it is possible to reduce the width of the base portion 4C in the second direction. The base portion 4C can be formed to have a small width in the second direction to the extent of the virtual external portion 21 mentioned above of each of the vibrating arm portions 3a and 3b not being required.

Second Embodiment

Next, a piezoelectric vibrator 50 including the above-mentioned piezoelectric vibrating piece 1, piezoelectric vibrating piece 1B, or piezoelectric vibrating piece 1C will be described with reference to FIGS. 8 and 9. In addition, only an external form of the piezoelectric vibrating piece 1 is shown in the drawing, and excitation electrodes 10 and 11, mounting electrodes 12 and 13, and the like have the same configurations as those in the above-described embodiment, and thus are not shown in the drawing. Although not described below, the same description can be given even when the piezoelectric vibrating piece 1B and the piezoelectric vibrating piece 1C are mounted.

Figure 8:
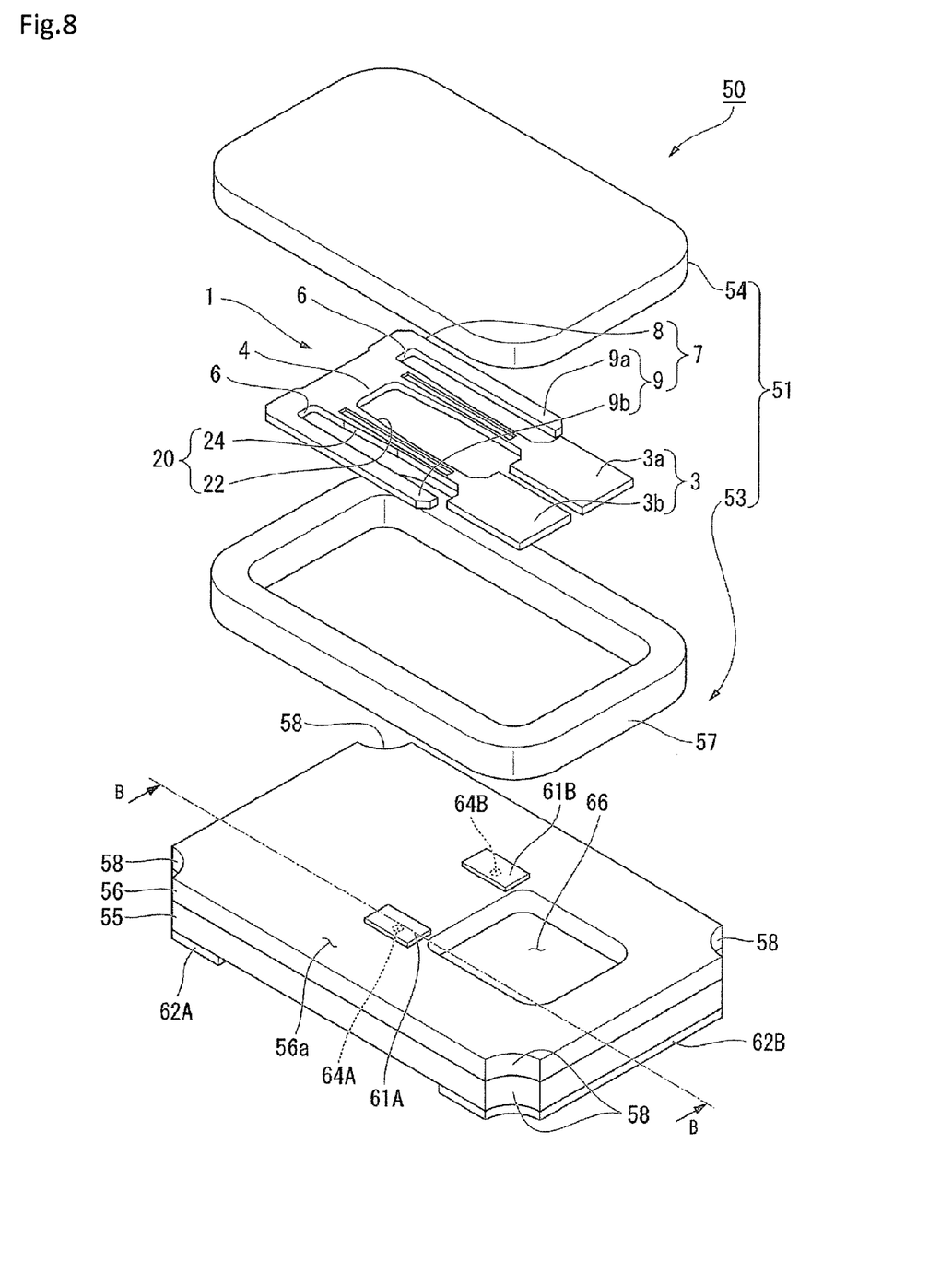
FIG. 8 is an exploded perspective view illustrating the entire configuration of a piezoelectric vibrator according to a second embodiment.

FIG. 8 is an exploded perspective view illustrating the entire configuration of the piezoelectric vibrator 50 according to the second embodiment. FIG. 9 is a cross-sectional view illustrating a configuration taken along line IX-IX in FIG. 8.

Figure 9:
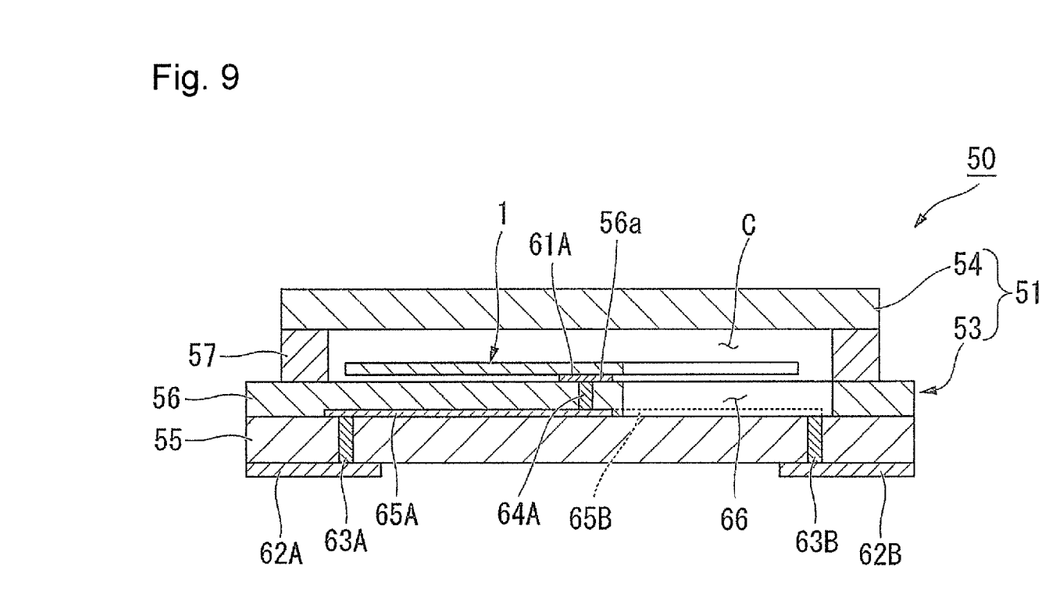
FIG. 9 is a cross-sectional view illustrating a configuration taken along line IX-IX in FIG. 8.

As illustrated in FIGS. 8 and 9, the piezoelectric vibrator 50 according to the present embodiment is a ceramic package type surface mounted vibrator including a package 51 having a cavity C which is sealed therein in an airtight manner, and the above-mentioned piezoelectric vibrating piece 1 which is accommodated in the cavity C.

The piezoelectric vibrator 50 is formed to have a substantially rectangular parallelepiped shape. In the present embodiment, the longitudinal direction of the piezoelectric vibrator 50 when seen in a plan view will be referred to as a length direction, the short direction thereof will be referred to as a width direction, and a direction perpendicular to the length direction and the width direction will be referred to as a thickness direction.

The package 51 includes a package main body (base substrate) 53 and a sealing plate (lid substrate) 54 which is bonded to the package main body 53 and has the cavity C formed between the package main body 53 and the sealing plate.

The package main body 53 includes a first base substrate 55 and a second base substrate 56 which are bonded to each other in an overlapping state, and a seal ring 57 which is bonded onto the second base substrate 56.

The first base substrate 55 is configured as a ceramic substrate formed to have a substantially rectangular shape when seen in a plan view. The second base substrate 56 is configured as a ceramic substrate formed to have a substantially rectangular shape when seen in a plan view which is the same external form as that of the first base substrate 55, and is integrally bonded onto the first base substrate 55 by sintering or the like in a state of being superimposed thereon.

A notch portion 58 having a quarter-arc shape when seen in a plan view is formed at four corners of the first base substrate 55 and the second base substrate 56 over the entirety of both the substrates 55 and 56 in the thickness direction. For example, the first base substrate 55 and the second base substrate 56 are manufactured by bonding two wafer-shaped ceramic substrates to each other, forming a plurality of through holes, passing through both the ceramic substrates, in matrix, and cutting off both the ceramic substrates in a lattice form on the basis of the through holes.

At this time, each of the through holes is divided into four parts, thereby forming the above-mentioned notch portion 58. In addition, the top face of the second base substrate 56 is configured as a mounting surface 56a on which the piezoelectric vibrating piece 1 is mounted.

Meanwhile, the first base substrate 55 and the second base substrate 56 are configured as ceramic substrates, and examples of a specific ceramic material include high temperature co-fired ceramic (HTCC) made of alumina, low temperature co-fired ceramic (LTCC) made of glass ceramic, and the like.

The seal ring 57 is a conductive frame-shaped member having an external form slightly smaller than those of the first base substrate 55 and the second base substrate 56, and is bonded to the mounting surface 56a of the second base substrate 56.

Specifically, the seal ring 57 is bonded onto the mounting surface 56a by baking using a brazing material, such as silver solder, or a solder material, or by welding to a metal bonding layer formed (formed by, for example, vapor deposition or sputtering in addition to electroplating or electroless plating) on the mounting surface 56a.

Meanwhile, examples of a material of the seal ring 57 include a nickel-based alloy and the like. Specifically, the material may be selected from Kovar, elinvar, Invar, a 42-alloy, and the like. In particular, it is preferable that a material having a thermal expansion coefficient close to those of the first and second base substrates 55 and 56 made of ceramic is selected as the material of the seal ring 57. For example, when alumina having a thermal expansion coefficient of $6.8 \times 10^{-6}/°$ C. is used for the first base substrate 55 and the second base substrate 56, it is preferable that Kovar having a thermal expansion coefficient of $5.2 \times 10^{-6}/°$ C. or a 42-alloy having a thermal expansion coefficient of $4.5 \times 10^{-6}/°$ C. to $6.5 \times 10^{-6}/°$ C. is used for the seal ring 57.

The sealing plate 54 is a conductive substrate superimposed on the seal ring 57, and is bonded to the package main body 53 in an airtight manner by bonding to the seal ring 57. A space defined by the sealing plate 54, the seal ring 57, and the mounting surface 56a of the second base substrate 56 functions as the above-mentioned cavity C which is sealed in an airtight manner.

Meanwhile, examples of a method of welding the sealing plate 54 include seam welding performed by a contact of a roller electrode, laser welding, ultrasonic welding, and the like. In addition, in order to reliably perform welding between the sealing plate 54 and the seal ring 57, it is preferable that bonding layers, such as nickel or gold, having good compatibility with each other are formed on at least the bottom face of the sealing plate 54 and the top face of the seal ring 57, respectively.

Incidentally, a pair of electrode pads 61A and 61B which are electrodes for connection to the piezoelectric vibrating piece 1 are formed on the mounting surface 56a of the second base substrate 56 at an interval in the width direction, and a pair of external electrodes 62A and 62B are formed on the bottom face of the first base substrate 55 at an interval in the length direction.

The electrode pads 61A and 61B and the external electrodes 62A and 62B are a single-layered film formed of a single metal by, for example, vapor deposition or sputtering or are a laminated film in which different metals are laminated on each other, and are electrically connected to each other.

The first base substrate 55 is provided with a first through electrode 63A which is electrically connected to the external electrode 62A and passes through the first base substrate 55 in the thickness direction. In addition, the second base substrate 56 is provided with a second through electrode 64A which is electrically connected to the electrode pad 61A and passes through the second base substrate 56 in the thickness direction. A connection electrode 65A connecting the first through electrode 63A and the second through electrode 64A is formed between the first base substrate 55 and the second base substrate 56. Thereby, the electrode pad 61A and the external electrode 62A are electrically connected to each other.

In addition, the first base substrate 55 is provided with a first through electrode 63B which is electrically connected to the external electrode 62B and passes through the first base substrate 55 in the thickness direction. Further, the second base substrate 56 is provided with a second through electrode 64B which is electrically connected to the electrode pad 61B and passes through the second base substrate 56 in the thickness direction. A connection electrode 65B connecting the first through electrode 63B and the second through electrode 64B is formed between the first base substrate 55 and the second base substrate 56. Thereby, the electrode pad 61B and the external electrode 62B are electrically connected to each other.

Meanwhile, the connection electrode 65B is patterned, for example, extending along the seal ring 57 below the seal ring 57 so as to avoid a concave portion 66 to be described later.

The concave portion 66 avoiding a contact with the vibrating arm portions 3a and 3b during the displacement (bending deformation) of the vibrating arm portions 3a and 3b in the thickness direction due to an influence of an impact caused by falling is formed in a portion facing the distal ends of the vibrating arm portions 3a and 3b on the mounting surface 56a of the second base substrate 56. The concave portion 66 is configured as a through hole passing through the second base substrate 56, and is formed to have a square shape when seen in a plan view in which four corners of the concave portion are rounded on the inner side of the seal ring 57.

The piezoelectric vibrating piece 1 is mounted through a metal bump not shown in the drawing, a conductive adhesive, or the like so that the mounting electrodes 12 and 13 (see FIG. 1) come into contact with the electrode pads 61A and 61B. Thereby, the piezoelectric vibrating piece 1 is supported in a state of being floated from the mounting surface 56a of the second base substrate 56, and is electrically connected to the pair of electrode pads 61A and 61B.

When the piezoelectric vibrator 50 configured in this manner is operated, a predetermined driving voltage is applied to the external electrodes 62A and 62B. Thereby, it is possible to apply a current to the excitation electrodes 10 and 11 of the piezoelectric vibrating piece 1 and to vibrate the pair of vibrating arm portions 3a and 3b with a predetermined frequency. In addition, the piezoelectric vibrator 50 can be used as a time source, a timing source of a control signal, a reference signal source, or the like using the vibration.

The piezoelectric vibrator 50 according to the present embodiment includes the high-quality piezoelectric vibrating piece 1 having stable vibration characteristics and capable of being made small, and thus can be configured as a high-quality piezoelectric vibrator having an excellent operational reliability. In addition, the piezoelectric vibrator 50 includes the piezoelectric vibrating piece 1 having a simple shape, and thus can be configured as a piezoelectric vibrator requiring a low manufacturing cost.

The embodiments of the present invention have been described so far in detail with reference to the accompanying drawings. However, the specific configuration of the present invention is not limited to the embodiments, and also includes a design change and the like without departing from the scope of the invention.

In the piezoelectric vibrating pieces 1, 1B, and 1C mentioned above, a constriction (notch) for reducing the widths thereof in the second direction may be provided on the end face 25 of each of the respective base portions 4, 4B, and 4C in the second direction. By the constriction being provided, it is possible to further increase an effect of suppressing vibration leakage in addition to an effect of suppressing vibration leakage due to the exclusion of the virtual external portion 21.

In addition, it is possible to appropriately replace components in the above-described embodiments with well-known components without departing from the scope of the invention.

What is claimed is:

1. A piezoelectric vibrating piece comprising:
   a pair of vibrating arm portions extending in a first direction; and
   a base portion that fixes the pair of vibrating arm portions,
   wherein the pair of vibrating arm portions are disposed in a second direction perpendicular to the first direction, and are configured such that base-ends thereof in the first direction are fixed to the base portion and distal-ends thereof in the first direction are configured to vibrate,
   wherein the vibrating arm portions have inclined surfaces on base-end sides in the second direction, such that a width of the vibrating arm portions in the second direction gradually widens from the distal-ends to the base-end, and
   wherein a length of the inclined surfaces in the first direction is equal to or greater than 0.25 times and equal to or less than 0.5 times of a total length of the vibrating arm portions from the base-ends to the distal-ends, such that an oscillation frequency thereof is equal to or less than 40 kHz, and a CI value thereof is equal to or less than 80 kΩ.

2. The piezoelectric vibrating piece according to claim 1, wherein the base-ends have an inner inclined surface on an inner side in the second direction and connected to an end face of the base portion,
   wherein the base ends have an outer inclined surface disposed on an outer side in the second direction and connected to an end face of the base portion in the second direction, and
   wherein an end point of the outer inclined surface at the base-ends is disposed closer to the distal-ends than an end point at the base-ends of the inner inclined surface.

3. The piezoelectric vibrating piece according to claim 1, wherein groove portions in front and back surfaces of the vibrating arm portions extend along the first direction and have a fixed width in the second direction from the base-ends of the vibrating arm portion to the distal-ends thereof.

4. The piezoelectric vibrating piece according to claim 3, wherein a distal end of the groove portions is closer to the distal-ends than a distal end point of the outer inclined surface, and
   wherein a end of the groove portions is closer to the base-ends than a base end point of the outer inclined surface.

5. The piezoelectric vibrating piece according to claim 1, wherein a total length of the vibrating arm portions is equal to or less than 0.1 mm.

6. The piezoelectric vibrating piece according to claim 1, further comprising:
   a pair of supporting arm portions that extend along the first direction on an outer side of the pair of vibrating arm portions in the second direction; and
   a connecting portion that connects the base portion and the supporting arm portion,
   wherein the pair of supporting arm portions are provided with a mounting electrode which is electrically connected to an outside circuit.

7. The piezoelectric vibrating piece according to claim 1, further comprising:
   a supporting arm portion that extends along the first direction between the pair of vibrating arm portions,
   wherein the supporting arm portion includes a mounting electrode that is electrically connected to an outside circuit.

8. A piezoelectric vibrator comprising:
   the piezoelectric vibrating piece according to claim 1; and
   a package that includes a base substrate and a lid substrate bonded to each other and accommodates the piezoelectric vibrating piece in a cavity between the substrates.

* * * * *

UNITED STATES PATENT AND TRADEMARK OFFICE
CERTIFICATE OF CORRECTION

PATENT NO. : 9,590,588 B2
APPLICATION NO. : 15/041558
DATED : March 7, 2017
INVENTOR(S) : Takashi Kobayashi et al.

It is certified that error appears in the above-identified patent and that said Letters Patent is hereby corrected as shown below:

In the Claims

In Column 15, Claim 1, Line 48, replace "base-end, and" with --base-ends, and--.

Signed and Sealed this
Twenty-ninth Day of May, 2018

Andrei Iancu
*Director of the United States Patent and Trademark Office*